United States Patent [19]
Terpstra et al.

[11] Patent Number: 5,523,049
[45] Date of Patent: * Jun. 4, 1996

[54] HEAT SINK AND METHOD OF FABRICATING

[75] Inventors: Robert L. Terpstra; Barbara K. Lograsso; Iver E. Anderson; Jeffrey A. Moore, all of Ames, Iowa

[73] Assignee: Iowa State University Research Foundation, Inc., Ames, Iowa

[*] Notice: The portion of the term of this patent subsequent to Mar. 10, 2014, has been disclaimed.

[21] Appl. No.: 332,959

[22] Filed: Nov. 1, 1994

Related U.S. Application Data

[63] Continuation-in-part of Ser. No. 208,809, Mar. 10, 1994, Pat. No. 5,366,688, which is a continuation of Ser. No. 988,217, Dec. 9, 1992, abandoned.

[51] Int. Cl.$^6$ ........................................................ B22F 3/14
[52] U.S. Cl. .................. 419/36; 419/44; 419/47; 419/48; 419/54; 419/55
[58] Field of Search .................. 264/63, 345; 361/387; 75/245, 242, 247, 249; 428/408, 552; 419/36, 44, 48, 54, 55, 47

[56] References Cited

U.S. PATENT DOCUMENTS

| | | | |
|---|---|---|---|
| 5,028,367 | 7/1991 | Wei | 264/63 |
| 5,045,972 | 9/1991 | Supan | 361/387 |
| 5,366,688 | 11/1994 | Terpstra et al. | 419/36 |

OTHER PUBLICATIONS

S. L. Spitz, EP&E, Feb. 1991, Conductive Polymers Come Out from the Labs, pp. 64–68.

*Primary Examiner*—Donald P. Walsh
*Assistant Examiner*—John N. Greaves
*Attorney, Agent, or Firm*—Flehr, Hohbach, Test, Albritton & Herbert

[57] ABSTRACT

A heat sink composed of thermally conductive particles dispersed in a monolithic structure having a continuous microstructure; and the method of forming a heat sink by molding the heat sink from a thermoplastic or epoxy material which has been filled with thermally conductive particles, debinding the molded heat sink and densifying the debound heat sink into a monolithic structure.

16 Claims, 5 Drawing Sheets

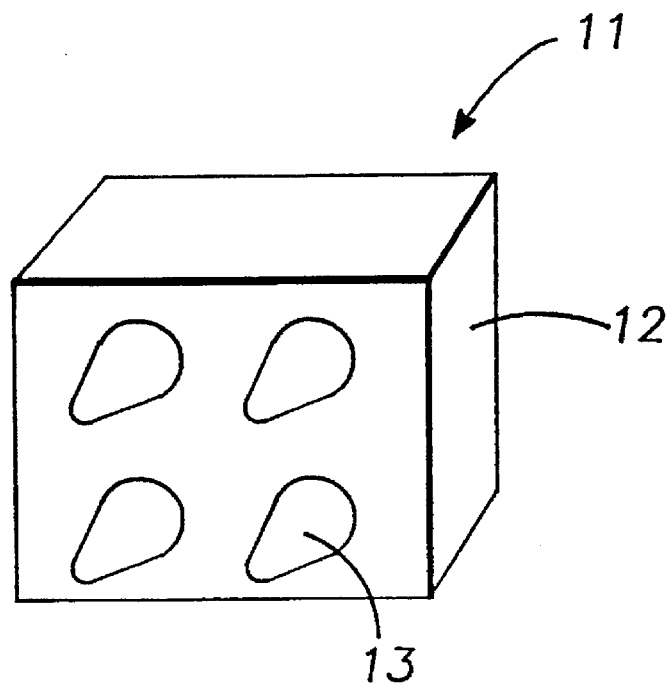
FIG.—1
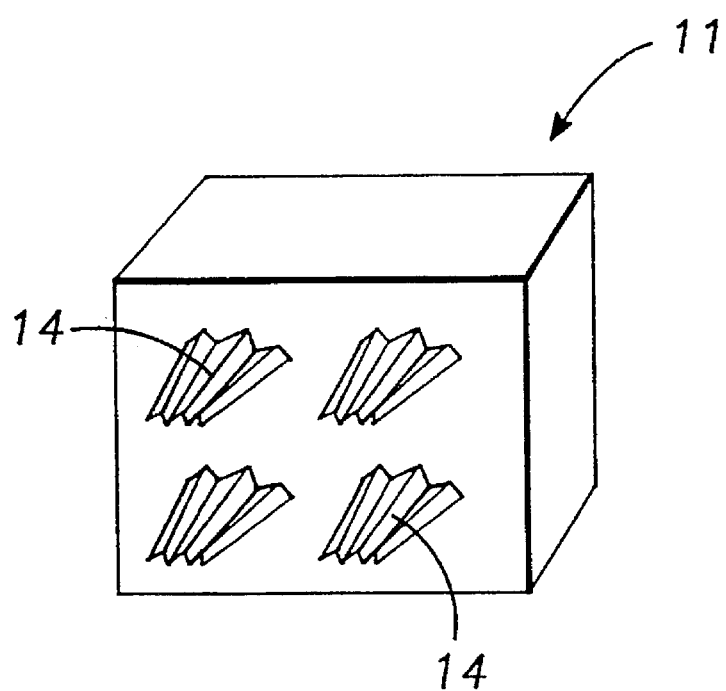
FIG.—2

FIG.—5

HEAT SINK AND METHOD OF FABRICATING

GOVERNMENT RIGHTS

The U.S. government has a paid-up license in this invention and the right in limited circumstances to require the patent owner to license others on reasonable terms as provided for by the terms of Contract No. ITA 87-02.

CROSS REFERENCE TO RELATED APPLICATIONS

This application is a continuation-in-part of U.S. Ser. No. 08/208,809 filed Mar. 10, 1994, now U.S. Pat. No. 5,366,688, which is a continuation of U.S. Ser. No. 07/988,217 filed Dec. 9, 1992, now abandoned. The disclosures of the above-mentioned applications are incorporated herein by reference.

BRIEF DESCRIPTION OF THE INVENTION

This invention relates generally to a heat sink and method of fabrication, and more particularly to a thermally conductive heat sink and method of fabrication.

BACKGROUND OF THE INVENTION

Excessive heat developed during operation of integrated circuits and particularly very large integrated circuits such as microprocessors, controllers and other high performance electronic logic devices can drastically reduce the reliability and efficiency of the circuit. The increased electronic packaging and power densities of many high performance devices often result in a high heat concentration within a limited area. Dissipation of the excessive heat is critical to prevent damage to or failure of the device. However, the high packaging density of the devices places many constraints on the design of a suitable thermal management system. Finding adequate methods to remove the excess heat has become a very important design parameter in building high performance electronic circuitry.

Many different approaches have been taken to disperse the excess heat that is generated in electronic circuits. One of the most common ways to dissipate the heat is through the use of heat sinks fabricated from extruded aluminum, but aluminum heat sinks have certain physical design limits. One limitation is the shape, which is limited to simple two-dimensional profile shapes that can be extruded. This reduces the potential for developing heat sinks having a reduced size or complex shapes which increase the convective and radiant cooling efficiency of the heat sink.

A new type of heat sink is constructed of filled polymer material that can be injection-molded into a variety of compact, complex shapes which are highly efficient for convective cooling with high velocity forced air. Although the filled polymer material has only about two percent of the thermal conductivity of pure aluminum, these complex-shaped devices have a cooling capacity that is comparable to bulky aluminum heat sinks that cannot fit in a compact, forced convection environment.

To install aluminum or polymer heat sinks, they must be mounted to the device that is to be cooled. This bond is usually accomplished by using mechanical fasteners, compressible pads, silicone grease or conductive epoxies. A major thermal management problem with bonding of these existing heat sinks is a reduction in thermal conductivity across the bond. Also any voids or gaps between the two joint surfaces can easily go undetected and can greatly reduce the thermal efficiency of the joint area.

Other heat sink approaches use liquid-filled pouches or copper-covered sponges compressed between the printed circuit board components and the outside casing of the instrument to transport the heat away from the heat source. The efficiency of the copper covered sponges is limited as heat is transferred only by the copper exterior. Moreover, these heat sinks greatly restrict the airflow through and around the printed circuit board and related chips. As a result, they appear to be limited to only special applications.

SUMMARY OF THE INVENTION

Accordingly, it is a general object of this invention to provide a new type of heat sink capable of dissipating the increasing heat loads of advanced integrated circuitry with improved efficiency and versatility.

It is another object of the invention to provide an improved injection-molded heat sink and method of fabrication.

It is yet another object of the invention to provide an injection-molded metal heat sink employing high conductivity powders fabricated in complex shapes and a method of manufacture.

It is still another object of the invention to provide heat sinks molded from a binder loaded with highly conductive powders.

It is a further object of the invention to provide an injection-molded heat sink that can be soldered to integrated circuits resulting in improved thermal conductivity across the bond between the heat sink and the circuit and in increased mechanical strength.

It is a further object of the invention to provide a molded heat sink having a substantially continuous microstructure.

These and other objects of this invention are achieved by a heat sink comprising a molded structure having a base and extended surface means of selected shape protruding from the base. The heat sink comprises a molded structure formed of a binder heavily loaded with conductive particles, or such a structure in which the binder is removed and the conductive particles are consolidated into a monolithic structure having a substantially continuous microstructure. The invention is further achieved by the method of forming a heat sink by molding a mixture of a highly conductive powder and a binder into a desired heat sink shape, removing the binder and processing the debound heat sink to form a heat sink having a substantially continuous microstructure.

BRIEF DESCRIPTION OF THE DRAWINGS

The purpose and advantages of this invention will be apparent to those skilled in the art from the following detailed description in conjunction with the appended drawings, in which:

FIG. 1 is a perspective view schematically showing a heat sink including four posts.

FIG. 2 is a schematic view of a heat sink with four configured posts.

DESCRIPTION OF PREFERRED EMBODIMENT

Figure 3:
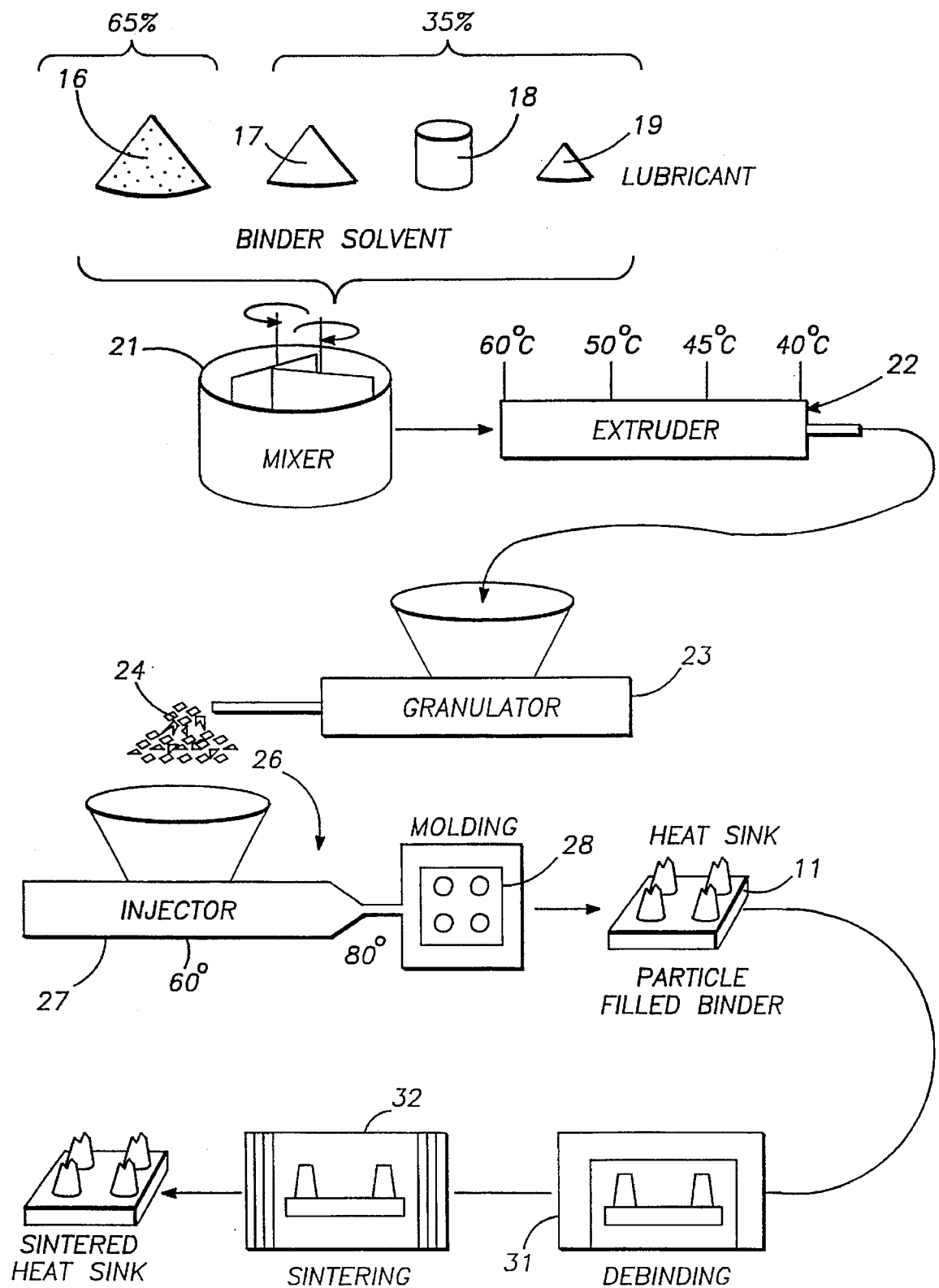
FIG. 3 is a schematic flow chart showing the fabrication of a heat sink in accordance with this invention.

Generally, in accordance with this invention, highly conductive particles are mixed with a binder and the mixture is molded into the shape of the desired heat sink. The heat sink is suitable for many applications as molded, providing a thermally conductive, particle-filled binder. Alternatively, for higher conductivity, the heat sink may be processed to remove the binder and form a monolithic heat sink with a continuous microstructure. The method of the invention can be used to economically produce heat sinks of desired thermal conductivity levels by appropriate selections of the conductive material, the particle size of the conductive material, the volume loading of the powder particles in the binder and the optional binder removal and post-debinding processes to which the molded shape may be subjected.

FIG. 1 schematically shows a heat sink 11 having a base 12 and integral outwardly projecting posts 13. This shape can be easily molded in accordance with this invention. It should, of course, be understood that this representation is only schematic and that posts having any desired configuration can be easily molded by the process of the invention. In FIG. 2, the heat sink 11 includes posts 14 which have a corrugated or shaped configuration to increase the surface area for heat transfer by radiation and conduction to the surrounding area. The shape of the heat sink may be tailored to the specifications of a particular application.

The heat sink 11 is manufactured in accordance with the present invention by molding a mixture of a highly conductive powder and a binder. The highly conductive powder is preferably a metal having a low thermal resistance. The metal powder may be produced using inert gas, air or water atomization processes using annular-slit nozzles, close-coupled nozzles or conventional free-fall nozzles; or the metal powder may be made by other processes such as electrolytic, grinding, chemical fiber processing, etc., that yield powders having the appropriate size for use in the fabrication of heat sinks. Suitable materials include metal, ceramic and intermetallic materials as for example copper, boron nitride, silver, aluminum, molybdenum, aluminum nitride, silicon carbide, silica, carbon, diamond powders. Alloys of these materials including chemical additives which do not significantly affect the thermal conductivity properties of the materials are also suitable for use. The particles are selected with a size distribution in the range of 0.1 to 100 microns with the preferred range being 0.1 to 38 microns.

The thermal conductivity of the heat sink will depend primarily on the thermal conductivity of the powder. A preferred material chosen for this application is copper. Copper has extremely high thermal and electrical conductivity and is available economically in high purity ingots or bar stock. Preferably, the copper powder is formed of a melt of electronic grade copper (99.99% pure) atomized by a high pressure inert gas atomization process (HPGA) of the type described by Ayers and Anderson in U.S. Pat. No. 4,619,845, the teaching of which is incorporated herein by reference. The electrical conductivity of HPGA copper powder pressed to full density was essentially equal to that of electronic grade copper, having a thermal conductivity of 226 BTU/ ft/hr/degree F. at 68° F. For comparison, the thermal conductivity of heat sinks comprising a polymer filled with aluminum is 3.1 BTU/ft/hr/degree F. at 68° F., and the thermal conductivity of commercial purity aluminum alloy used for heat sinks is approximately 128 gTU/ft/hr/degree F. at 68° F. Although the commercial purity copper powder has a slightly reduced electrical conductivity relative to the HPGA copper, the conductivity of the commercial copper powder is far superior to aluminum powder.

Another preferred material having a high thermal conductivity is a copper-silver compound such as a compound of 80% electronic grade copper (99.99% pure) and 20% silver (99.999% pure). The compound is preferable atomized by the HPGA process to form the copper-silver powder particles. The powder particles have a fine microstructure consisting of silver rich solid solution phases and copper rich solid solution phases. As with the copper powder, the copper-silver powder has a high thermal conductivity far superior to aluminum powder.

The binder material is selected from certain materials which are effective in wetting and bonding the powder particles under the molding conditions of a particular application. Generally, binders useful in this invention are characterized as having a low viscosity. Suitable binders include thermoplastic or thermosetting polymers such as polyethylene, polyproylene, polystyrene, waxes, unsaturated polyester resins, phenolic, nylon, urea-formaldehyde resins and so-called engineering resins or compounds thereof. The binders may include a coupling agent such as glycerol, titanate, stearic acid, polyethylene glycol, humic acid, ethoxylated fatty acids and other known coupling agents to achieve higher loading of the powder particles in the binder. A preferred low viscosity binder for the sintered heat sinks described in this invention comprises a mixture of high fluidity, short chain, low molecular weight components.

Referring to FIG. 3, the powder particles 16 are either screen-classified or air-classified so that they fall within the desired range of particle size. The powder particles 16 and pellets of a low viscosity binder 17 including a solvent 18 and a lubricant 19, if desired, are heated and mixed into a compound which is then heated and molded to the desired shape. The particles 16 and binder 17 provide a feed stock which may be molded to a desired shape under relatively low heat and pressure. Coloring agents 20 may also be added to the mixture to increase the emissivity of the heat sink 11 or to color the heat sink to provide for example a visual indication of the thermal conductivity or the identity of the manufacturer of the heat sink. The binder and thermally conductive powder are mixed in proportions selected to provide the desired thermal conductivity for the heat sink. The thermal conductivity is dependent upon the amount of powder in the mixture or volume loading of powder in the binder, with a high volume loading of powder offering increased thermal conductivity. Blends of 20 to 80 volume percent copper have been found to be highly satisfactory. High volume loading of powder, for example 70–80%, may be achieved by using the fine spherical particles produced by HPGA process. Blends of different particle sizes can also be used to achieve optimum volume loading, whereby the smaller particles can fit in the interstices between the larger particles to provide a higher volume filling.

The powder particles 16 and binder 17 are preferably mixed as shown in FIG. 3, although it should be understood that other processes may be used to mix the binder and powder particles into a compound. As shown in FIG. 3, the powder particles 16, binder pellets 17 and any additives are mixed in the mixer 21 and then fed into a twin-screw extruder 22 which further mixes and extrudes the mixture. The extruder preferably heats the powder particles 16 and binder pellets 17 and uses moderate to high shear mixing to provide a homogeneous feedstock. The extruder may include a plurality of heating zones having temperatures determined by such factors as the thermally conductive and binder materials employed and the volume percent loading of the particles 16, with the highest temperature located at the extrusion end. For example, in the embodiment illustrated in FIG. 3, the extruder may have four zones set at 40° C., 45° C., 50° and 60° C. After the material is extruded, it is cooled and supplied to the granulator 23 where it is ground into compound pellets 24. To ensure complete mixing, the process of mixing-extrusion-granulation may be repeated several times.

After the compound has been completely mixed, the ground compound pellets 24 are then heated and molded to the desired shape. Instead of adding the coloring agents 20 when the binder and powder particles are initially mixed in the mixer 21, the coloring agents may be added to the compound pellets 24 when heated. The heat sink 11 may be formed by injection molding, extrusion, rotation molding, pressure molding, compression molding, etc. In the process shown in FIG. 3, for example, the comthe pound pellets 24 are supplied to a reciprocating screw injection molder 26. The injector 26 may also have a plurality of heating zones, where the temperature at the injection end 27 of the injector is 80° C. The heated mixture is injected into a molding cavity 28. The cavity is then opened, and the shaped heat sink 11 is allowed to cool.

As previously described, in many applications the heat sink may be used directly as molded, with the conductivity of the molded heat sink being dependent upon the particle volume loading, particle conductivity and polymer conductivity. The thermal conductivity increases as the volume fraction of powder particles increases. Spherical powder particles are more easily molded than irregular particles at the higher volume fractions of loading; however, this does not preclude the use of irregular particles such as carbon fibers in molding applications. Non-spherical particles with a rough surface have a lower packing density and coordination number than spherical particles due to both physical constraints and particle interaction. The increased surface roughness results in interlocking of particles and greater difficulty for particles trying to slide past one another. For example, molding of the irregular copper powder with binder was difficult because of the loss of fluidity, whereas the mixture of binder with the fine spherical copper powder was still very fluid at 60 volume percent.

If a conductivity near that of the thermally conductive particles is desired, the molded heat sink is further processed. First, the binder is removed from the molded heat sink in a debinding process. This may be accomplished by placing the ejected molded heat sink on a non-reacting substrate and positioning the heat sink and substrate in a vacuum furnace 31 or other controlled atmosphere as for example argon, nitrogen, hydrogen, helium, oxygen or mixtures thereof. The heat sink is then subjected to a heating cycle while it is under a vacuum or subjected to a controlled atmosphere to remove the binder. The heating cycle includes progressively heating and retaining the heat sink at a selected temperature for a period of time. In one example of a heating cycle the heat sink is heated to a temperature of 95° C. at a rate of 20°/hr and held at 95° C. for two hours. The heat sink is then heated to 250° C. at the rate of 5°/hr and held at 250° C. for two hours. The heat sink is then heated to 325° C. at a rate of 5°/hr and held at 325° C. for two hours, and then the heat sink is cooled to a temperature of 20° C. as rapidly as possible, for example at 665°/hr.

After the completion of the debinding process, the debound part has a porous microstructure structure created by the removal of the binder. The debound part is further processed to densify the interconnected particulate body into a solid monolithic heat sink having a substantially continuous microstructure similar to that of a solid sample of the thermally conductive material used to form the powder particles 16. Various processes such as sintering, liquid phase sintering, pressure assisted sintering including hot isostatic pressing, forging and electro-consolidation, and reaction consolidation may be used to densify the debound part into a monolithic heat sink.

In the embodiment shown in FIG. 3, the debound part is loaded into an atmosphere controlled furnace 32 which is purged with high purity grade argon for half an hour. For the copper, after the furnace has been purged with argon, the furnace is turned on and a blend of hydrogen and helium is introduced into the furnace. The heat sink is then heated to a predetermined temperature and held at that temperature for a period of time and then cooled. For the copper example, the heat sink is heated to 1000° C. and held at that temperature for one hour while the hydrogen/helium mixture continues to flow into the furnace. The part is then cooled under flowing argon. The result is a sintered heat sink in which the thermally conductive particles are joined to one another to provide high conductivity, near that of the pure material. Furthermore, the heat sink can be soldered directly to an associated integrated circuit.

Figure 4:
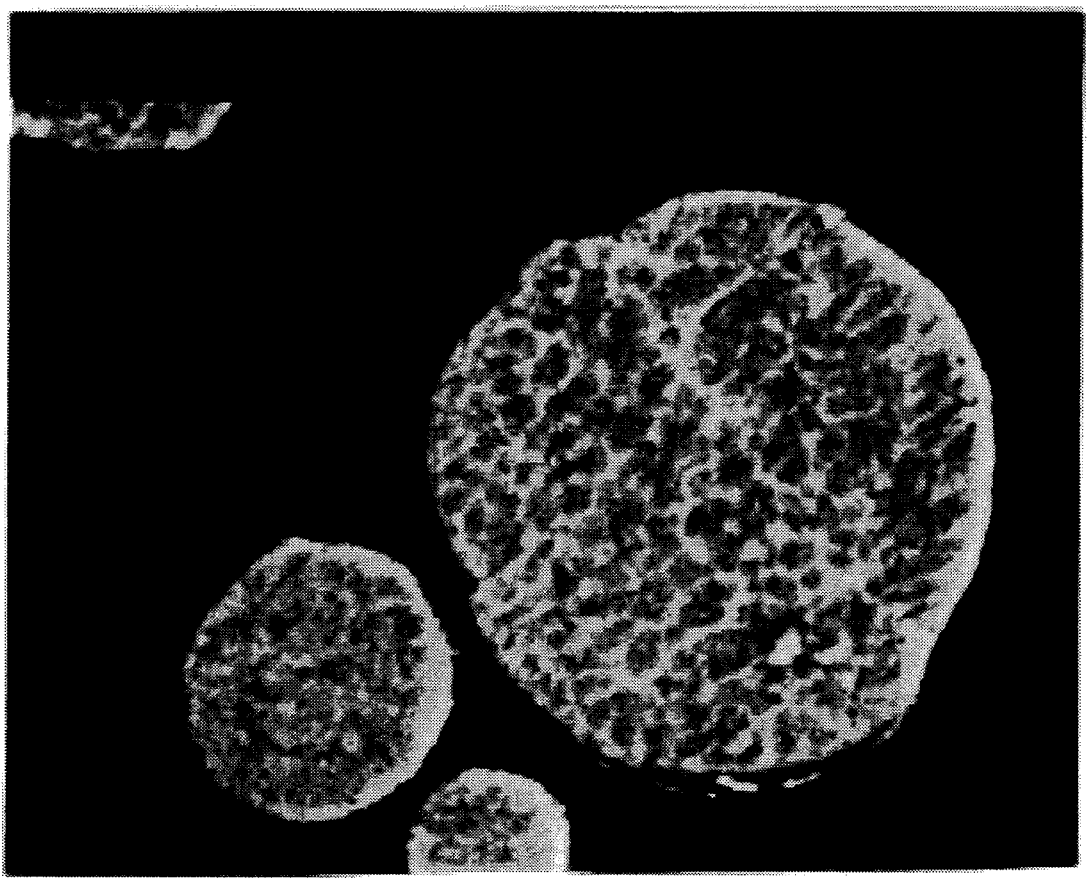
FIG. 4 is a micrograph of powder particles formed of a melt of 80% copper and 20% silver, shown at 6210X magnification.
Figure 5:
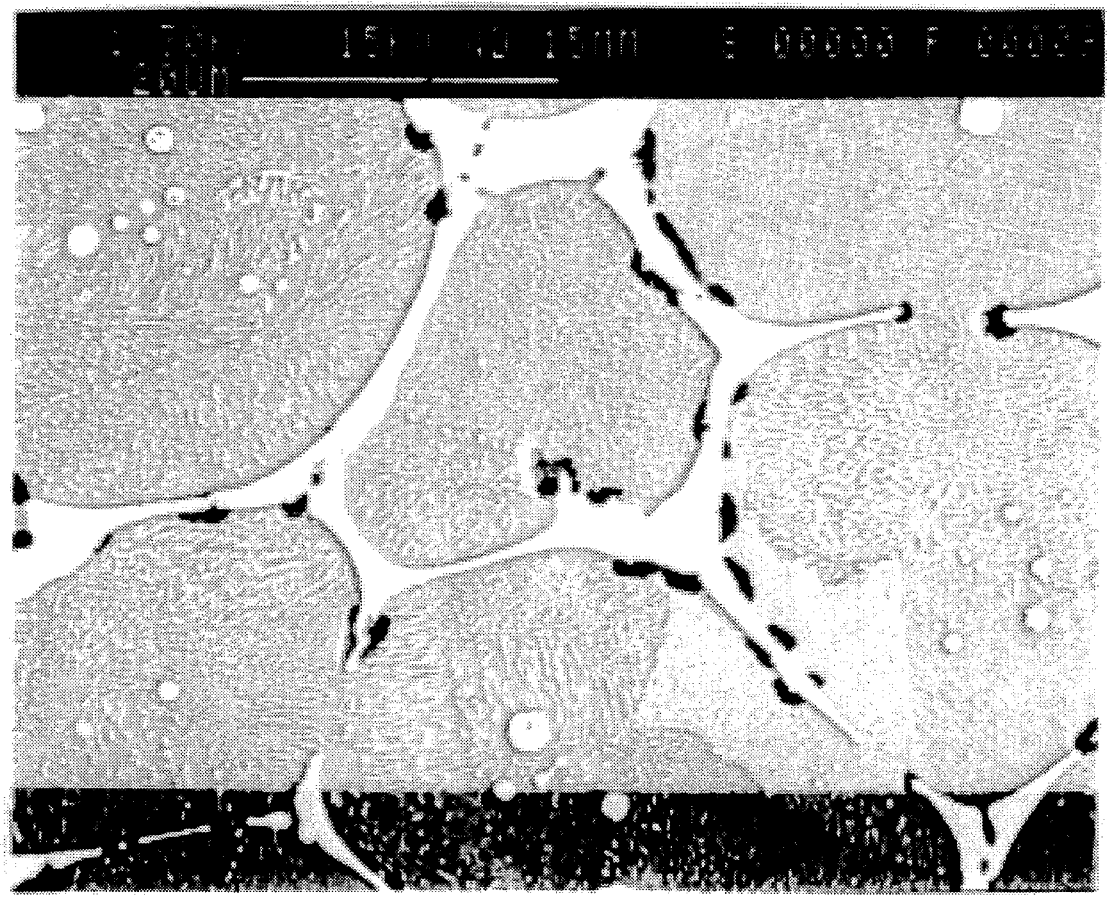
FIG. 5 is a micrograph of a heat sink following liquid phase sintering processing at 790° C. for fifteen minutes, shown at 1300X magnification.
Figure 6:
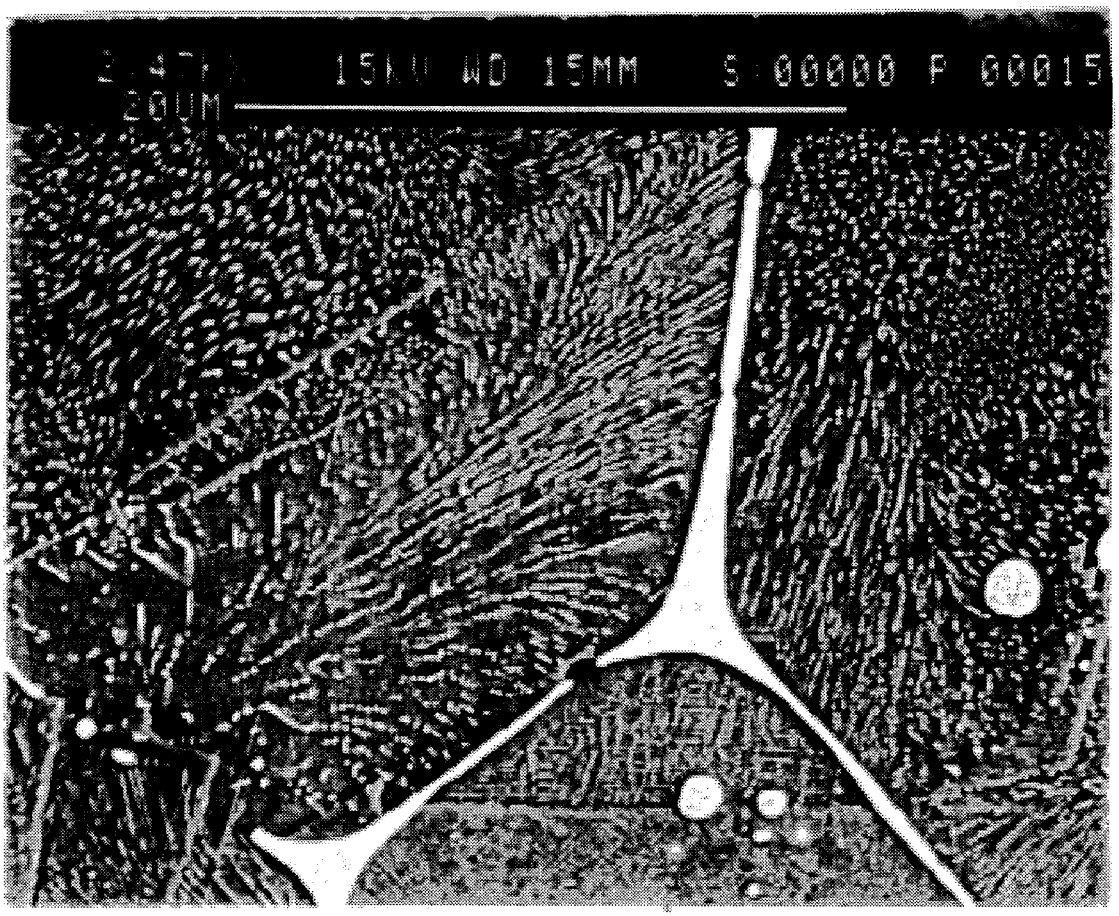
FIG. 6 is a micrograph of a heat sink following liquid phase sintering processing at 780° C. for fifteen minutes, shown at 2470X magnification.

In one example, a heat sink mold 1-inch square by approximately ½-inch thick with four ⅛-inch pins was used to form a heat sink of the type shown in FIG. 1. Sixty-five percent (65%) by volume copper powder and 35% by volume binder heat sinks were produced using the mixing, molding, debinding and sintering procedure set forth above. Measurements of the heat sinks as molded and the sintered hat sinks show that the average measured shrinkage for the pin heat sinks was 7.33% across the length, 7.41% across the width, 5.35% for the thickness, and 5.15% for the mass. Immersion bulk density measurements indicate that the as-molded, debound and sintered sample has 2.18, 29.92 and 13.69% open porosity, respectively. In another example, a copper-silver powder was formed of a melt of 80% electronic grade copper (99.99% pure) and 20% silver (99.999% pure) atomized by the HPGA process. FIG. 4 shows the fine microstructure of the powder particles which consist of silver rich solid solution phases (the white areas in FIG. 4) and copper rich solid solution phases (the gray areas in FIG. 4). The copper-silver powder particles were mixed with a low molecular weight binder, molded into a heat sink and debound as described above in relation to FIG. 3. The debound heat sink was subjected to a liquid phase sintering process to densify the heat sink to a solid monolithic structure. The heat sink was heated at 790° C for fifteen minutes in a flowing reducing atmosphere, for example an atmosphere of 5% hydrogen and 95% helium. The heat sinks were then moved from the furnace center toward the end of the furnace and rapidly cooled in flowing reducing atmosphere. A second debound heat sink was heated at 780° C. for fifteen minutes in flowing reducing atmosphere and then cooled in the same manner as the first copper-silver heat sink. As shown in FIGS. 5 and 6, the heat sinks processed by liquid phase sintering have microstructures which indicate high levels of densification. For liquid phase sintering processes, the amount of densification is determined by the composition of the debound heat sink and the sintering temperature. Preferably, the liquid content achieved during the sintering process is approximately 20% to 30% liquid by volume to avoid slumping and promote full densification and grain growth. The debound heat sink may also be compacted into a monolithic heat sink having a substantially continuous microstructure by heating the debound part and rapidly applying pressure to the heated part by forging the debound part using a forging press. For example, the debound heat sink may be embedded in a heated, pressure transmitting media, such as a granular ceramic material, which transfers the applied force to the debound part to consolidate the material into a monolithic structure. The debound heat sink is preferably heated and then positioned in the hot pressure transmitting medium. The forging process is very rapid, usually consolidating the material in seconds. The forging process is usually conducted at a pressure above the elevated temperature yield stress of the selected material. The temperature is selected to promote atomic diffusion at grain boundaries or within the volume of grains within the powder particles. Another method of rapidly applying pressure to the heated debound heat sink is the electro-consolidation process. The debound part is packed in a bed of graphite grains. Pressure is uniaxially applied to the debound part, with the graphite grains distributing pressure across the heat sink. As pressure is applied, the graphite grains are exposed to an electrical current to heat the debound part during the consolidation process. The resulting temperature is a function of the internal resistance of the material. Another process which may be used to consolidate the debound heat sink is hot isostatic pressing. As the debound part is heated, a gaseous substance functions as the pressure transmitting media to apply pressure to the debound heat sink, consolidating the debound heat sink to a monolithic body having a continuous microstructure. The debound part may also be positioned in a shaped container which is heated in a gas pressurizing atmosphere. The elevated temperature and pressure facilitate the production of a continuous microstructure. As with the forging process, hot isostatic pressing is usually conducted at pressures above the yield stress of the particular material at the elevated temperature. The elevated temperature is selected to promote atomic diffusion at grain boundaries or within the volume of grains within the powder particles.

Thus, there has been provided a heat sink which can be molded into desired shapes from a highly thermal conductive material comprising thermally conductive particles dispersed in a binder. The heat sink can be used with the binder in place, or it may be processed to provide a solid monolithic heat sink having a continuous microstructure and a thermal conductivity approaching the conductivity of the thermally conductive material.

What is claimed:

1. A method of fabricating a heat sink having a selected configuration comprising the steps of:

mixing powder particles of at least one material having a relatively high thermal conductivity with a polymer binder to form a powder particle/binder mixture;

molding the powder particle/binder mixture into a heat sink having the selected configuration;

debinding the molded heat sink to remove said binder therefrom by positioning the molded heat sink in a controlled environment and heating the molded heat sink to a plurality of predetermined temperatures and retaining said heat sink at each of said predetermined temperatures for a predetermined period of time to evaporate said binder from the molded heat sink to provide a particulate body formed of said powder particles; and processing the particulate body to consolidate said powder particles into a monolithic heat sink having a substantially continuous microstructure.

2. The method of claim 1 in which the step of processing the debound heat sink includes processing the debound heat sink using a process selected from the group comprising sintering, liquid phase sintering, electro-consolidation processing, forging and hot isostatic pressing.

3. The method of claim 1 in which said step of mixing powder particles includes mixing particles of a copper and silver powder with said binder.

4. The method of claim 1 in which the thermally conductive material is selected from the group comprising copper, silver, boron nitride, aluminum, molybdenum, aluminum nitride, silicon carbide, silica, carbon, diamond and alloys of said materials having a thermal conductivity similar to the thermal conductivity of said materials.

5. A heat sink comprising an interconnected particulate body formed of particles of a thermally conductive material and having a base and extended surface means, said body being densified to form interparticle bonds between said particles and provide said body with a substantially continuous microstructure.

6. The heat sink of claim 5 in which said particulate body is formed of particles of a copper silver alloy.

7. A heat sink as in claim 5 in which said thermally conductive material is selected from the group of materials comprising copper, silver, boron nitride, aluminum, molybdenum, aluminum nitride, silicon carbide, silica, carbon, diamond and alloys of said materials having a thermal conductivity similar to the thermal conductivity of said materials.

8. The heat sink of claim 5 in which said particles are densified by a process selected from the group comprising liquid phase sintering, electro-consolidation processing, forging and hot isostatic pressing.

9. The method of claim 1 in which said step of positioning the molded heat sink in a controlled environment includes positioning the molded heat sink in a vacuum environment.

10. The method of claim 1 in which said step of processing the particulate body includes heating the particulate body and applying pressure to the heated particulate body.

11. The method of claim 10 in which said step of applying pressure includes forging the particulate body in a forging press.

12. The method of claim 11 in which said step of forging the particulate body includes positioning the particulate body in a heated pressure transmitting medium, said transmitting medium transferring the applied pressure to the particulate body.

13. The method of claim 10 in which said step of applying pressure includes positioning the particulate body in a bed of graphite grains for uniformly distributing pressure across the particulate body and said step of heating the particulate body includes applying an electrical current to said graphite grains.

14. The method of claim 10 in which said step of applying pressure includes positioning the particulate body in a chamber filled with a gaseous substance, said gaseous substance applying pressure to the heated particulate body.

15. The method of claim 1 in which said step of processing the particulate body includes heating the particulate body to a temperature at which said particulate body is in a liquid phase and a solid phase for a predetermined period of time and rapidly cooling the heated particulate body to densify the heated particulate body into said monolithic structure.

16. The method of claim 15 in which in which said processing step includes heating the particulate body until the particulate body has a liquid content of about 20–30 percent liquid by volume.

* * * * *

UNITED STATES PATENT AND TRADEMARK OFFICE
CERTIFICATE OF CORRECTION

PATENT NO. : 5,523,049
DATED : June 4, 1996
INVENTOR(S) : TERPSTRA, R.L., et al.

It is certified that error appears in the above-indentified patent and that said Letters Patent is hereby corrected as shown below:

In Col. 4, line 3, change "128 gTU/ft/hr/degree F" to --128 BTU/ft/hr/degree F--.

In Col. 6, line 41, start a new paragraph with the sentence beginning with "In another example, a".

In Col. 6, line 63, start a new paragraph with the sentence beginning with "For liquid phase sintering".

In Col. 7, line 2, start a new paragraph with the sentence beginning with "The debound heat sink may also be".

In Col. 7, line 17, start a new paragraph with the sentence beginning with "Another method of".

In Col. 7, line 26, start a new paragraph with the sentence beginning with "Another process which".

Signed and Sealed this

Thirty-first Day of December, 1996

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,523,049
DATED : June 4, 1996
INVENTOR(S) : Robert L. Terpstra et al.

It is certified that error appears in the above-identified patent and that said Letters Patent is hereby corrected as shown below:

Column 1,
Line 4, delete "GOVERNMENT RIGHTS", and insert -- STATEMENT REGARDING FEDERALLY SPONSORED RESEARCH AND DEVELOPMENT --
Line 6, insert -- This invention was made in part with government support under United States Department of Commerce Contract No. ITA 87-02. --
Line 9, after "of", insert -- United States Department of Commerce --

Signed and Sealed this

Eighteenth Day of January, 2005

JON W. DUDAS
*Director of the United States Patent and Trademark Office*